United States Patent [19]
Razeghi

[11] Patent Number: 6,108,360
[45] Date of Patent: *Aug. 22, 2000

[54] LONG WAVELENGTH DH, SCH AND MQW LASERS BASED ON SB

[76] Inventor: Manijeh Razeghi, 1500 Sheridan Rd., Wilmette, Ill. 60091

[*] Notice: This patent issued on a continued prosecution application filed under 37 CFR 1.53(d), and is subject to the twenty year patent term provisions of 35 U.S.C. 154(a)(2).

[21] Appl. No.: 08/870,985

[22] Filed: Jun. 6, 1997

[51] Int. Cl.$^7$ ........................................................ H01S 5/00

[52] U.S. Cl. ................................................................ 372/45

[58] Field of Search ................................. 372/45, 43, 46; 438/46, 47, 39, 41, 36

[56] References Cited

U.S. PATENT DOCUMENTS

| | | | |
|---|---|---|---|
| 4,630,083 | 12/1986 | Yamakoshi | 372/45 |
| 4,964,134 | 10/1990 | Westbrook et al. | 372/45 |
| 5,577,061 | 11/1996 | Hasenberg et al. | 372/45 |
| 5,625,635 | 4/1997 | Kurtz et al. | 372/45 |

OTHER PUBLICATIONS

Mayer et al, Electronic Materials Science: for Integrated Circuits in SI and GAAS, New York: Macmillan Publishing Company, 1990, inside backcover. (no month available), 1990.
Casey, Jr. et al, Heterostructure Lasers: Part B:: Materials and Operating Characteristics, New York: Academic Press, 1978, p. 24. (no month available), 1978.
Kim et al., Photoluminescence Study of InAsSb/InAsSbP Heterostructures Grown by Low–Pressure Metalorganic Chemical Vapor Deposition, Appl. Phys. Lett. 69 (11), pp. 1614–1616, Sep. 9, 1996.
Diaz et al., InAsSbP/InAsSb/InAs Laser Diodes ($\lambda$=3.2 $\mu$m) Grown by Low–Pressure Metal–Organic Chemical–Vapor Deposition, Appl. Phys. Lett. 70 (1), pp. 40–42, Jan. 6, 1997.
Lane et al., Compressively Strained Multiple Quantum Well InAsSb Lasers Emitting at 3.6 $\mu$m Grown by Metal–Organic Chemical Vapor Deposition, Appl. Phys. Lett. 70 (4), pp. 443–445, Jan. 27, 1997.
Wu et al., InAsSbP–InAsSb–InAs Diode Lasers Emitting at 3.2 $\mu$m Grown by Metal–Organic Chemical; Vapor Deposition, IEEE Photonics Technology Letters, vol. 9, No. 2, pp. 173–175, Feb. 2, 1997.
Lane et al., Study on the Effects of Minority Carrier Leakage in InAsSb/InPAsSb Double Heterostructure, Appl. Phys. Lett. 70 (11), pp. 1447–1449, Mar. 17, 1997.
Yi et al., Stability of far fields in double heterostructure and multiple quantum well InAsSb/InPAsSb/InAs as midinfrared lasers, Appl. Phys. Lett. 70 (18), pp. 1–4, May 5, 1997.
M. Razeghi et al, High Power InAsSb/InAsSbP Laser Diodes Emitting at 3~5 $\mu$m Range, Mat. Res. Soc. Symp. Proc. vol. 450, pp. 13–22, 1997 (No Month Available).

*Primary Examiner*—Teresa M. Arroyo
*Assistant Examiner*—Quyen P. Leung
*Attorney, Agent, or Firm*—Welsh & Katz, Ltd.

[57] ABSTRACT

InAsSb/InAsSbP/InAs Double Heterostructures (DH) and Separate Confinement Heterostructure Multiple Quantum Well (SCH-MQW) structures are taught wherein the ability to tune to a specific wavelength within 3 $\mu$m to 5 $\mu$m is possible by varying the ratio of As:Sb in the active layer. Further, the active layer of a DH structure can be doped with a p-type dopant, so that the dopant level of the active layer is at least one magnitude less than the dopant level of either confinement layer and the n-p junction is within the active layer and a higher power level and better efficiency is observed. A perfect lattice matching of the InAsSb contact layers and InAsSbP confinement layer of a DH structure is found to minimize the dislocation density at the InAsSb/InAsSbP interface. Decreasing the band-offset between the active layer and the confinement layers increases the brightness of the laser. A SCH laser of the subject invention can obtain a minimum discontinuity of conduction band between the confinement layers and the waveguide by adjusting the thickness of the waveguide and the number of quantum wells. The wavelength of the emitted light can be controlled, over the range of 3 $\mu$m to 5 $\mu$m by changing the material composition of the active layer, by changing the thickness of the quantum well, or by changing both parameters.

1 Claim, 13 Drawing Sheets

FIG.1

LASER STRUCTURE

BAND DIAGRAM

ELECTRICAL INJECTION – SPECTRAL CHARACTERIZATION

FIG. 11B 5.0 μm MQW

LONG WAVELENGTH DH, SCH AND MQW LASERS BASED ON SB

This invention is made with government support under Grant DAAH04-951-0343 awarded by the DARPA/United States Army. The government has certain rights in the invention.

This application relates to semiconductor III-V alloy DH, SCH and VCSEL laser structures and to a method of preparing such structures for use in mid-infrared lasers.

BACKGROUND OF THE INVENTION

The growth of semiconductor III-V compounds by chemical vapor deposition (CVD) using organometallics and hydrides as elemental sources has recently developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

Open-tube flow systems are used at atmospheric or reduced pressures in producing the III-V alloys. The process requires only one high-temperature zone for the in situ formation and growth of the semiconductor compound directly on a heated substrate.

Low pressure (LP-) MOCVD growth method offers an improved thickness uniformity and compositional homogeneity, reduction of autodoping, reduction of parasitic decomposition in the gas phase, and allows the growth of high-quality material over a large surface area. The LP-MOCVD technique has been successfully used to grow an InAsSb/InAsSbP alloy on an InAs substrate. InAsSbP alloys, which are potentially useful materials both for heterojunction microwave and optoelectronic device applications can be grown by liquid-phase epitaxy (LPE), molecular-beam epitaxy (MBE), conventional vapor-phase epitaxy (VPE), as well as MOCVD and MOMBE.

While each of the above processes are viable, certain disadvantages exist; for example, LPE experience growth problems with InAsSbP alloys and potential nonuniform growth as well as melt-back effect. Molecular-beam epitaxy is a very expensive and complex process, and difficulties have been reported with p-type doping and with the growth of phosphorus-bearing alloys. Vapor-phase epitaxy disadvantages include potential for hillock and haze formation and interfacial decomposition during the preheat stage.

The technique of LP-MOCVD is well adapted to the growth of the entire composition range of InAsSbP layers of uniform thickness and composition on InAs substrates. This results first from the ability of the process to produce abrupt composition changes and second from the result that the composition and growth rate are generally temperature independent. It is a versatile technique, numerous starting compounds can be used, and growth is controlled by fully independent parameters.

Growth by MOCVD takes place far from a thermodynamic equilibrium, and growth rates are determined generally by the arrival rate of material at the growing surface rather than by temperature-dependent reactions between the gas and solid phases.

One of the key reasons for the usefulness of this method is the possibility of obtaining high-purity and therefore high-mobility InAsSbP. As long-wavelength 2–6 $\mu$m InAsSbP electro-optical devices become more widely used, motivated by low fiber absorption and dispersion, high transmission through water and smoke, and greatly enhanced eye safety at wavelengths greater than 2 $\mu$m, LP-MOCVD offers the advantages of smooth uniform surfaces, sharp interfaces (lower than 5 Å for InAsSbP/InAs), uniformly lower background doping density, and economy of scale for large-area devices.

It is well known that the mid-infrared range from 3–5 $\mu$m is very attractive for several spectroscopic applications including atmospheric trace gas analysis and medical diagnostics, because in this spectral region many atmospheric species have strong rotational, vibrational and overtone absorption bands. Unfortunately, the performance of narrow band-gap semiconductor lasers is strongly influences by Auger processes and carrier leakage effects.

The high quality of double heterostructure laser diodes based on the InAsSb/InAsSbP alloy on InAs substrate (100) grown by MOCVD is known which shows low threshold current density and a high output power. However, for the InAsSb/InAsSbP system it would be desirable to have a system which is tunable to emit a specific wavelength at room temperature, with power and long life.

SUMMARY OF THE INVENTION

An object, therefore, of the invention is the growth of high quality InAsSb/InAsSbP ($\lambda$ between 3 and 5 $\mu$m) double heterostructures and separate confinement heterostructures.

A further object of the subject invention is a separate confinement heterostructure or multiple quantum well laser structure grown with long life at low temperature.

A still further object of the subject invention is a method of controlling laser performance and life and energy gap of the diode laser by selectively varying the well thickness, barrier thickness and waveguide thickness of a multi-quantum well or a DH structure.

These and other objects are attained by the subject invention wherein MQW (multi-quantum well) and DH (double heterostructure) diode lasers of the formula InAsSb/InAsSbP on InAs substrates as well as other Al-free DH and MQW structures are found to be superior to other lasers in terms of quantum efficiency and temperature rise at the mirror facets.

In addition, it has been found that in a III-V structure, if the active layer is doped with a p-type dopant, so that the dopant level of the active layer is at least one order of magnitude less than the dopant level of either confinement layer and the n-p junction is within the active layer, then a higher power level and better efficiency is observed.

In a further aspect of the subject invention, a primary concern is a perfect lattice matching of the InAsSb contact layers and InAsSbP confinement layer of a DH structure in order to minimize the dislocation density at the InAsSb/InAsSbP interface. This is done by adjusting the composition of $InAs_xSb_x$, specifically by adjusting x from 1 to 0 and, preferably, adjusting x from 0.99 to 0.01.

In a further aspect of the subject invention, it has been found that if the band-offset between the active layer and the confinement layers is decreased, then the brightness of the laser is increased.

A separate confinement heterostructure (SCH) laser of the subject invention can obtain a minimum discontinuity of conduction band between the confinement layers and the waveguide. Further, the thickness of the waveguide should be between 1000 Å to 1$\mu$m. The quantum well may be between one and ten (1–10) wells, with one-half p-doped to a level one order of magnitude, less than the level of either of the confinement layers. By doing so, there results homogeneous carrier injection and a p-n junction in the middle of the waveguide.

In a DH or SCH structure, a semiconductor alloy such as $InAs_xSb_{1-x}$, the wavelength of the emitted light can be controlled, over the range of 3 μm to 5 μm by changing the material composition of the active layer, by changing the thickness of the quantum well, or by changing both parameters.

DESCRIPTION OF THE DRAWINGS

These and other objects are attained, together with additional features contributing thereto and advantages accruing therefrom will be apparent from the following detailed description of various embodiments of the invention when used in conjunction with the accompanying drawings, wherein.

DETAILED DESCRIPTION OF THE INVENTION

The reactor and associated gas-distribution scheme used herein are as those generally known in the art. The system generally was a cooled quartz reaction tube (diameter 5 cm in the substrate area) pumped by a high-capacity roughing pump (120 hr$^{-1}$) to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and VCR fittings. Flow rates were controlled by mass flowmeters.

The reactor was purged with a hydrogen flow of 4 liters min$^{-1}$, and the working pressure of 78 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

The gas sources used in this study for the growth of InAsSbP by LP-MOCVD are listed below.

| Group-III Sources | Group-V Sources | |
|---|---|---|
| $In(CH_3)_3$ | $AsH_3$ | $As(t-Bu)_3$ |
| $In(C_2H_5)_3$ | $As(C_2H_5)_3$ | $Sb(CH_3)_3$ |
| $(CH_3)_2In(C_2H_5)$ | $As(CH_3)_3$ | $Sb(C_2H_5)_3$ |
| $P(t-Bu)_3$ | $HAS(C_2H_5)_3$ | $SbH_3$ |
| | $PH_3$ | |

The organometallic group-III species trimethyl Antimony (TmSb) are contained in stainless steel bubblers, which are held in controlled temperature baths at 0 C., respectively. An accurately metered flow of purified $H_2$ for TMI and TmSb is passed through the appropriate bubbler. To ensure that the source material remains in vapor form, the saturated vapor that emerges from the bottle is imrnediately diluted by a flow of hydrogen. The mole fraction, and thus the partial pressure, of the source species is lower in the mixture and is prevented from condensing in the stainless steel pipe work.

Pure and diluted arsine ($AsH_3$) and pure phosphine ($PH_3$) are used as sources of As and P, respectively. The metal alkyl or hydride flow can be either injected into the reactor or into the waste line by using two-way valves. In each case, the source flow is first switched into the waste line to establish the flow rate and then switched into the reactor. The total gas flow rate is 8 liters min$^{-1}$ during growth. Stable flows are achieved by the use of mass flow controllers.

Dopants usable in the method of the subject invention are as follows:

| n dopant | p dopant |
|---|---|
| $H_2Se$ | $(CH_3)_2Zn$ |
| $H_2S$ | $(C_2H_5)_2Zn$ |
| $SiH_4$ | $(C_2H_5)_2Be$ |
| $S_2H_6$ | $(C_2H_5)_2Mg$ |
| $(CH_3)_3Sn$ | $(CH_3)_2Cd$ |
| $(C_2H_5)_3Sn$ | |

Semi-insulating or n$^+$ substrates are supplied by MCP, Crystacomm, Metals Research, or Sumitomo in the form of ingots or polished wafers. Wafers are sliced 2° off (100) toward (110) and chemically etched for 10 seconds at room temperature in a 15% bromine-methanol solution in order to remove 20 μm from each side. The wafers were then mechanochemically polished in a solution of 1.5% bromine in methanol, removing a further 80–100 μm. The substrates were finally cleaned in methanol and rinsed in isopropyl alcohol. The substrates were etched again, just before use, by dipping in 1% bromine in methanol at room temperature for one minute, rinsing in warm isopropyl alcohol, and drying. An n$^+$ tin-doped substrate was used for each experiment.

The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

Figure 2:
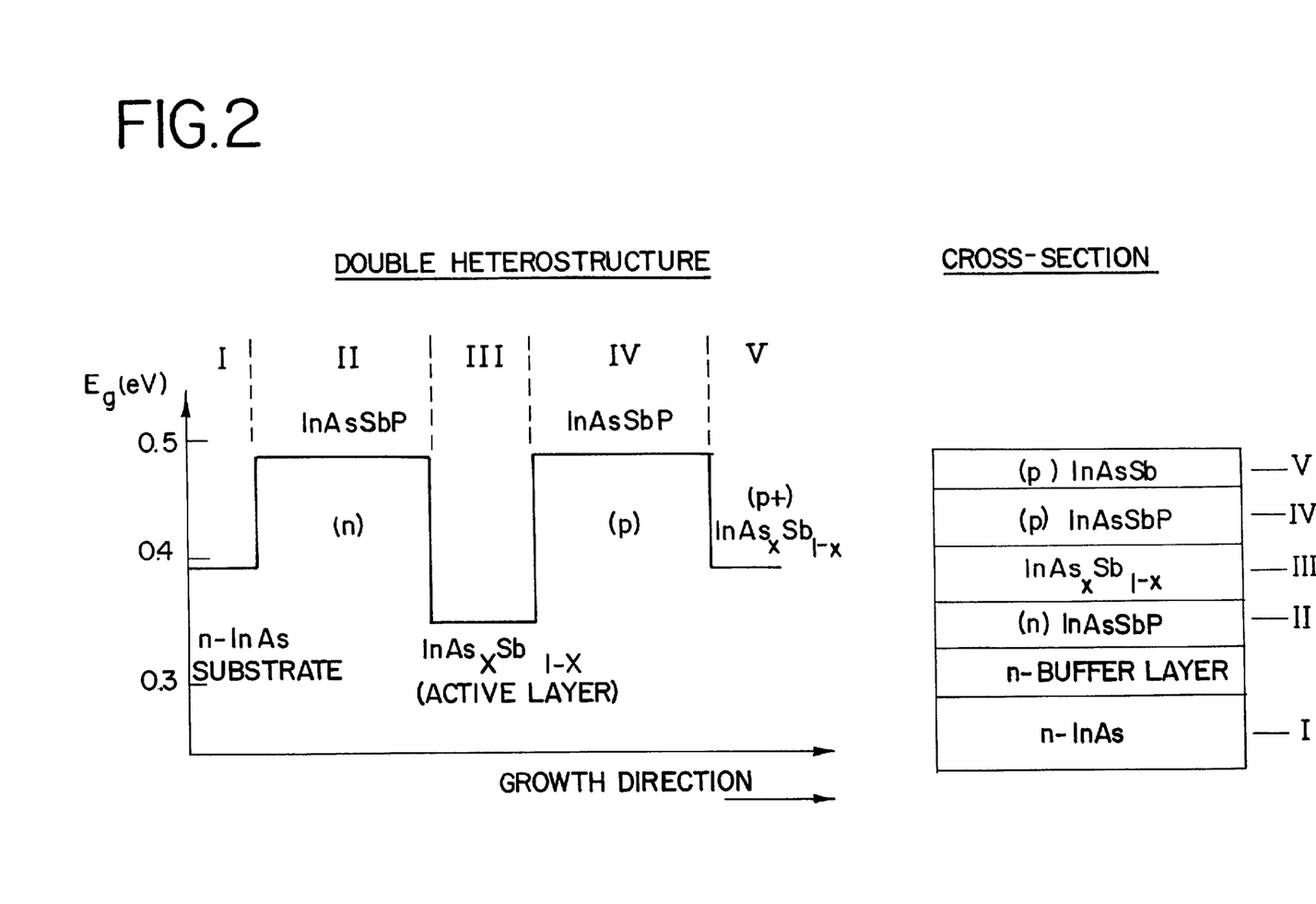
FIG. 2 is a band diagram of a double heterostructure InAsSbP/InAsSb/InAs with InAsSb as the cap layer.
Figure 3:
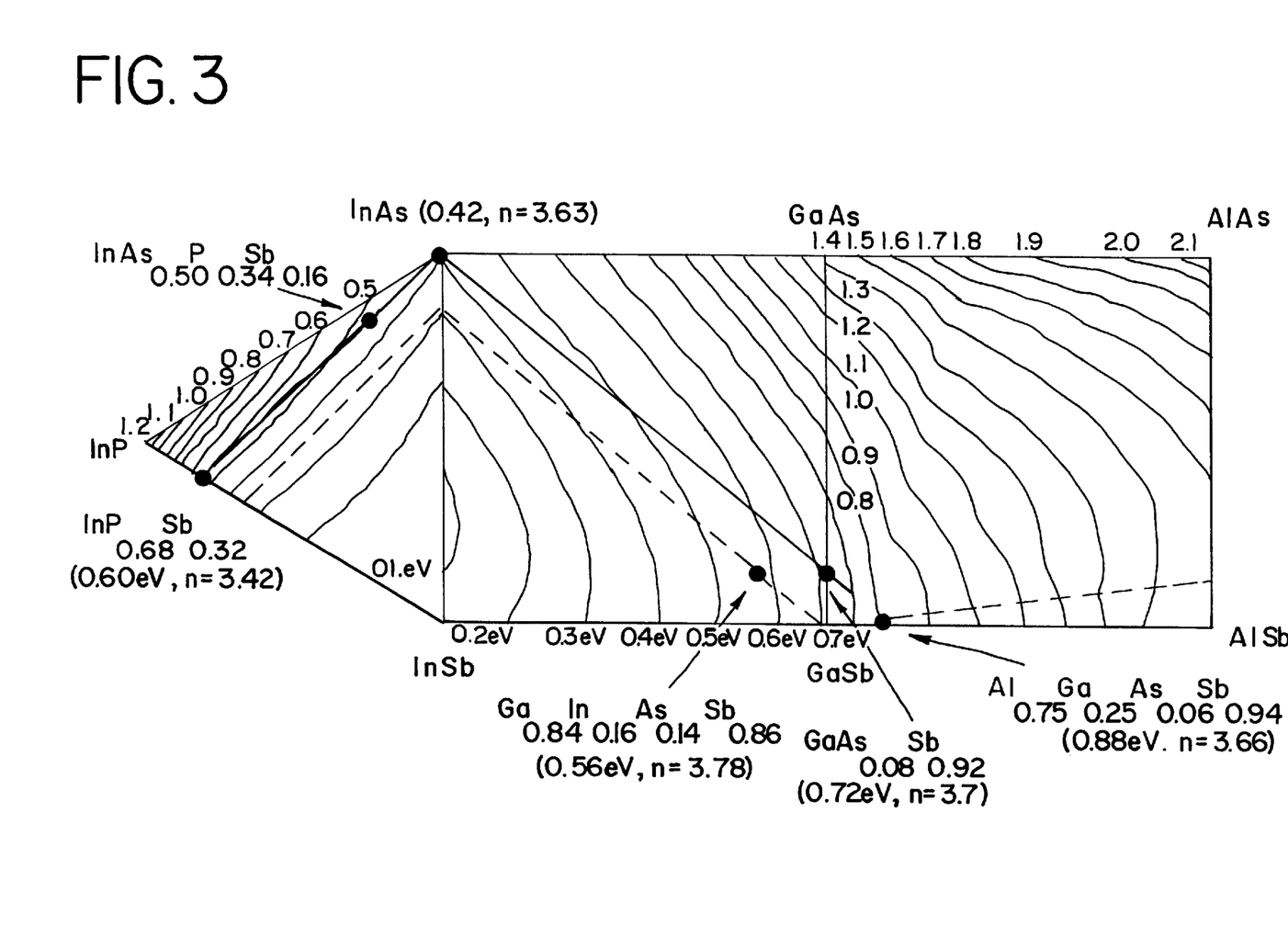
FIG. 3 is a schematic diagram of bandgap v. composition for Sb-based alloys.
Figure 4:
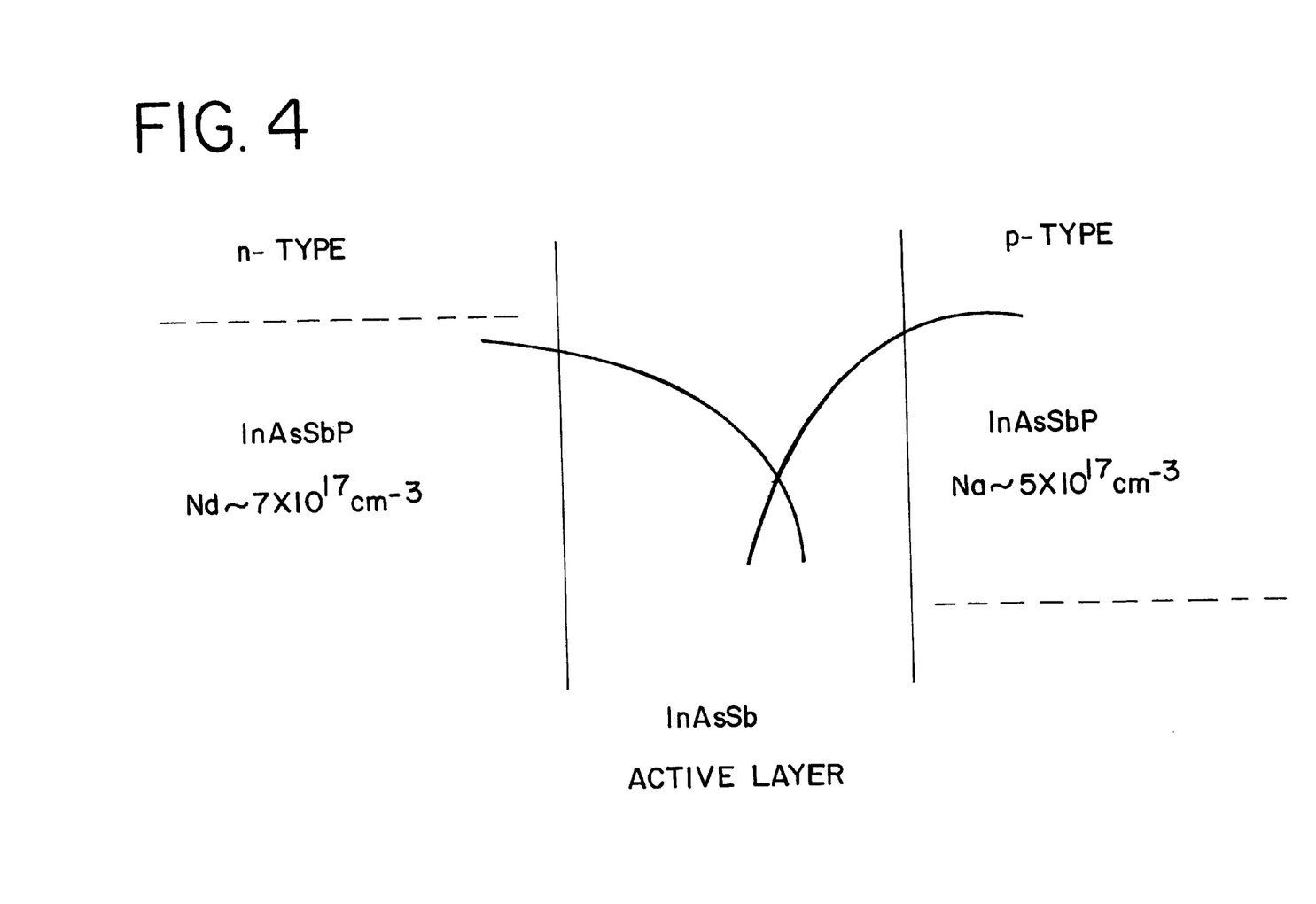
FIG. 4 is a diagram of a p-n junction of an InAsSbP/InAsSb structure.

The invention is described in accordance with the drawings and, in particular, with respect to FIGS. 2, 3 and 4. FIG. 2 is a schematic cross-section of a double heterostructure InAsSbP/InAsSb/InAs laser structure formed in accordance with the subject invention.

Figure 1:
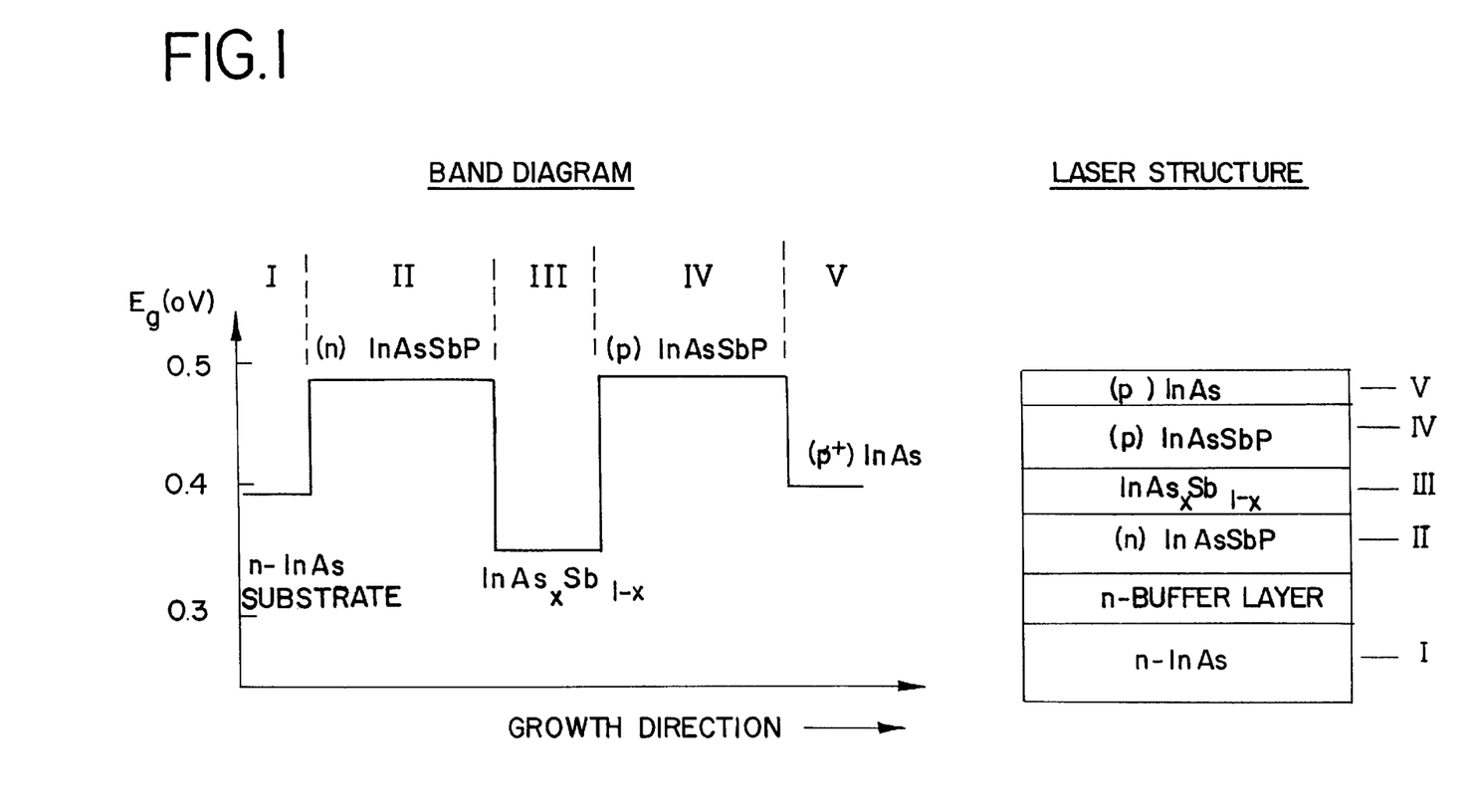
FIG. 1 is a band diagram of a DH InAsSbP/InAsSb/InAs structure with InAs as the cap layer of the subject invention.

The epitaxial layers for the Double Heterostructure (DH) and the Separate Confinement Heterostructure (SCH) of InAsSb/InAsSbP/InAs may be grown by low-pressure metallorganic chemical vapor deposition (LP-MOCVD) although MBE, LPE and UPE may be used. A typical DH InAsSbP/InAsSb/InAs laser structure of the subject invention as depicted in FIG. 1 comprises the following: a (100) oriented Te-doped (~$10^{18}$ $cm^{-3}$) n-InAs substrate, a 1.2 $\mu$m-thick Sn-doped ($N_4$~$7\times10^{17}$ $cm^{-3}$) n-InAsSbP cladding layer, a 1.0 $\mu$m-thick undoped InAsSb active layer, a 1.2 $\mu$m-thick Zn-doped ($N_a$ ~$5\times10^{17}$ $cm^{-3}$) p-InAsSbP cladding layer and a 0.07 $\mu$m–0.09 $\mu$m-thick Zn-doped (~$10^{20}$ $cm^3$) p-InAs cap layer. FIG. 2 shows the band structure of a DH laser structure having a cap layer of p-InAsSb in place of the cap layer of InAs in FIG. 1. By this use of InAsSb as the cap layer, the whole structure is better lattice matched, which allows the current voltage curve to be improved, the laser performance to be improved and the life of the laser extended.

The key to such good performance and long life is lattice matching each layer, i.e., the contact layer, confinement layers and active layers are all lattice matched, with substantially identical lattice parameters. This is accomplished by adjusting the composition of $InAs_{1-x}Sb_{1-x}$ such that the lattice parameters are matched to that of the quaternary layer and $0.01 \leq x \leq 0.99$.

In the alternative to using materials with similar compositions, InAs could be used and lattice matched to other materials. FIG. 3 shows such possibilities. For instance, the combination of InAs, InSb and InP material give the quaternary layer InAsSbP and each has substantially the same lattice parameters, as is shown by being on the same solid line.

The separate confinement heterostructure multiple quantum well (SCH-MQW) laser structure is shown in FIG. 6: n-InAs doped substrate ($10^{18}$ $cm^{-1}$), a 1.2 $\mu$m thick doped ($N_a$~$7\times10^{17}$ $cm^{-3}$) n-InAsSbP cladding layer, a 0.2 $\mu$m undoped layer of InAs or InAsSbP with higher As composition than that in the InAsSbP cladding layer in order to give optical confinement, an undoped InAsSb/InAsSbP multi-quantum well active region (10 wells), a 0.2 $\mu$m undoped waveguide layer of InAs or InAsSbP, 1.2 $\mu$m-thick Zn-doped ($N_a$~$5\times10^{17}$ $cm^{-3}$) p-InAsSbP cladding layer and a 0.07 $\mu$m–0.09 $\mu$m thick Zn-doped (~$10^{20}$ $cm^{-3}$)p InAsSb cap layer. FIG. 3 shows the band structure of the SCH-MQW InAsSbP/InAsSb/InAs laser structure in accordance with the subject invention. The DH and SCH-MQW layers can be grown on (100) InAs substrates that are doped by a combination of Te, Si, Ge or S dopants. In general, the design and fabrication of DH and SCH-MQW laser structures offers a number of interesting characteristics. The most important characteristic includes: low threshold current density, a small variation of the threshold current with temperature, high differential quantum efficiency, low series resistance, high characteristic temperature $T_o$ and the ability to tune to a particular wavelength.

As stated, samples are grown in the horizontal, cold-wall, quartz tube low pressure metallorganic chemical vapor deposition (LP-MOCVD) reactor of FIG. 1 at a pressure of 78 torr. The precursor source used herein are trimethyl indium (TMIn), trimethyl antimony (TMSb) and both pure and diluted arsine ($AsH_3$) and phosphine ($PH_3$). Diethylzinc (DEZn) and Tetraethyltin (TeSn) are used for p-type and n-type doping, respectively. Other combinations of p-dopants such as Mg, Cd and Be are used for the upper p-InAsSbP cladding layer in which the LP-MOCVD system is very versatile in providing such combinations of dopants. Furthermore, the LP-MOCVD system has the ability to dope the p-InAs cap layer with a high dopant concentration in the range of $10^{20}$ $cm^{-3}$ so as to provide low series resistance. The growth temperature was varied from 460° C. to 510° C. in order to obtain a high-quality InAsSb active layer. The growth rate has approximately a linear relationship with the mass flow of TMIn, which indicates a diffusion-limited process in this temperature range.

The V/III ratio is also very critical in growing InAsSbP alloys. For the active layer, the V/III molar gas flow ratio is varied between 40 to 100, keeping the same composition x of $InAs_xSb_{1-x}$, and $V_{AsH3}:V_{TMSb} \neq 2.4:1$ for a Sb composition of 5~6%. For the upper and lower cladding layers, the V/III molar gas flow ratio is also about 70 and the growth condition was varied with the ratio of flow rate of As/Sb, As/P and Sb/P. The growth condition was optimized to improve the crystalline quality, increase the energy gap and to make sharp interfaces between InAsSb/InAsSbP. Due to the different thermal stabilities for precursors $PH_3$ and TMSb and different sticking coefficients of elemental phosphorous and antimony on the semiconductor surface, it is important to find the proper flow rate and the growth temperature. The stable hydride $PH_3$ requires a much larger residence time for efficient cracking in the hot zone above the susceptor than the less stable TMSb, which causes difficulties in controlling the relative rates of incorporation of P and Sb into the solid. It is well known that when during the growth of Sb-containing materials, the excess Sb will generate droplets on the sample surface and give a very rough surface morphology. In the growth of InAsSb and InAsSbP, the group V composition is dominated by As and P. The much stronger As and P driving force for incorporation prevents the excess Sb from bonding with the sample surface, thus no Sb droplets are generated. A high flow rate of TMSb is helpful to obtain a smooth surface and high crystal quality. The growth rate, another important parameter, was varied between 0.8 $\mu$m/hr and 1.5 $\mu$m/hr. The lowering of the growth rate will improve the crystal quality; a growth rate is employed around 1 $\mu$m/hr to compromise both the total growth time for the relatively thick layers and the crystalline quality.

Prior to loading into the reactor chamber, the n-type (100) InAs substrates were decreased with organic solvents and etched with a $H_2SO_4:H_2O_2:H_2O$ (1:1:1) solution. The inventive laser structure comprises an (n) InAsSbP buffer layer and a 1.0 μm p-type doped InAs$_x$Sb$_{1-x}$ active layer. The active layer is sandwiched between an InAsSbP lower cladding layer and an upper cladding layer of InAsSb. A final cap layer of p-doped ($10^{20}$ cm$^{-3}$) InAs or InAsSb layer is grown.

TABLE 1

Optimum growth conditions of InAsSbP/InAsSb/InAs structure.

|  | InAs | InAsSbP | InAsSb |
| --- | --- | --- | --- |
| Growth Pressure (Torr) | 76 | 76 | 76 |
| Growth Temperature (° C.) | 520 | 520 | 520 |
| Total H$_2$ Flow (liter/min) | 7 | 7 | 7 |
| AsH$_3$ (cc/min) | 50 | 20 (5% diluted AsH$_3$) | 8 |
| TMI (cc/min) | 100 | 120 | 120 |
| TmSb (cc/min) | — | 80 | 50 |
| PH$_3$ (cc/min) | — | 12 | — |
| Growth Rate (Å/min) | 150 | 180 | 175 |

For InAsSb ($\lambda$=3.2 μm), one obtains the ratio of partial pressure of $P_{As+Sb}/P_{In}=47, P_{As}/P_{Sb}=4,$ $P_{(As+P)}/P_{(In+Sb)}\neq 600.$ After optimization of growth conditions for InAs and InAsSb layers, LP-MOCVD has been successfully used for the growth of InAsSb and InAsAlSb double heterostructure layers, for laser applications emitting between 3 and 5 μm. The various compositions were produced by controlling the flow of the relevant component, as in the case of InAsSbP mentioned previously.

The inventive grown wafers of DH and SCH InAsSbP/InAsSb/InAs are fabricated by the following procedure and conditions:

Broad-area lasers with 100 μm-wide contact stripes are fabricated on a p-doped ($\neq\times10^{20}$cm$^{-3}$) InAs layer by depositing metal layers of Ti (300 Å–450 Å)/Pt(400 Å–550 Å)/Au (1800 Å–2300 Å) by utilizing lift-off techniques. The InAs cap layer between the patterned stripes is chemical etched using H$_2$SO$_4$:H$_2$O$_2$:H$_2$O (1:1:40) ratio in order to localize the injection current in the lateral direction. The n-InAs substrate is mechanically lapped and polished to a thickness of 100 μm–120 μm. A final n-type ohmic contact is formed on the n-InAs substrate by depositing AuGe (700 Å–800 Å)/Ni(300 Å–400 Å)/Au(1800 Å–2300 Å). Thermal treatment of the p- and n-ohmic contacts are performed at temperatures between 300° C.–320° C. for 3–4 minutes under controllable forming gas ambient (10% H$_2$—N$_2$) to obtain low-contact resistance of 0.2 Ω at 78K and 0.60 Ω at 300K. The wafers are cleaved into single diode chips ranging from 300 μm to 1500 μm in cavity length. The single diodes are bonded onto a coated indium copper heatsink prior to testing. The SCH and DH InAsSbP/InAsSb/InAs diode lasers are measured in both pulse (pulse width: 6 μs - 200 Hz) and cw operations. For chips cleaved from the same bar, the standard deviation in the lasing threshold current density is only ±5%. For a large slice area (10 cm$^2$), the standard deviation in lasing threshold was typically less than 20%.

Figure 5A:
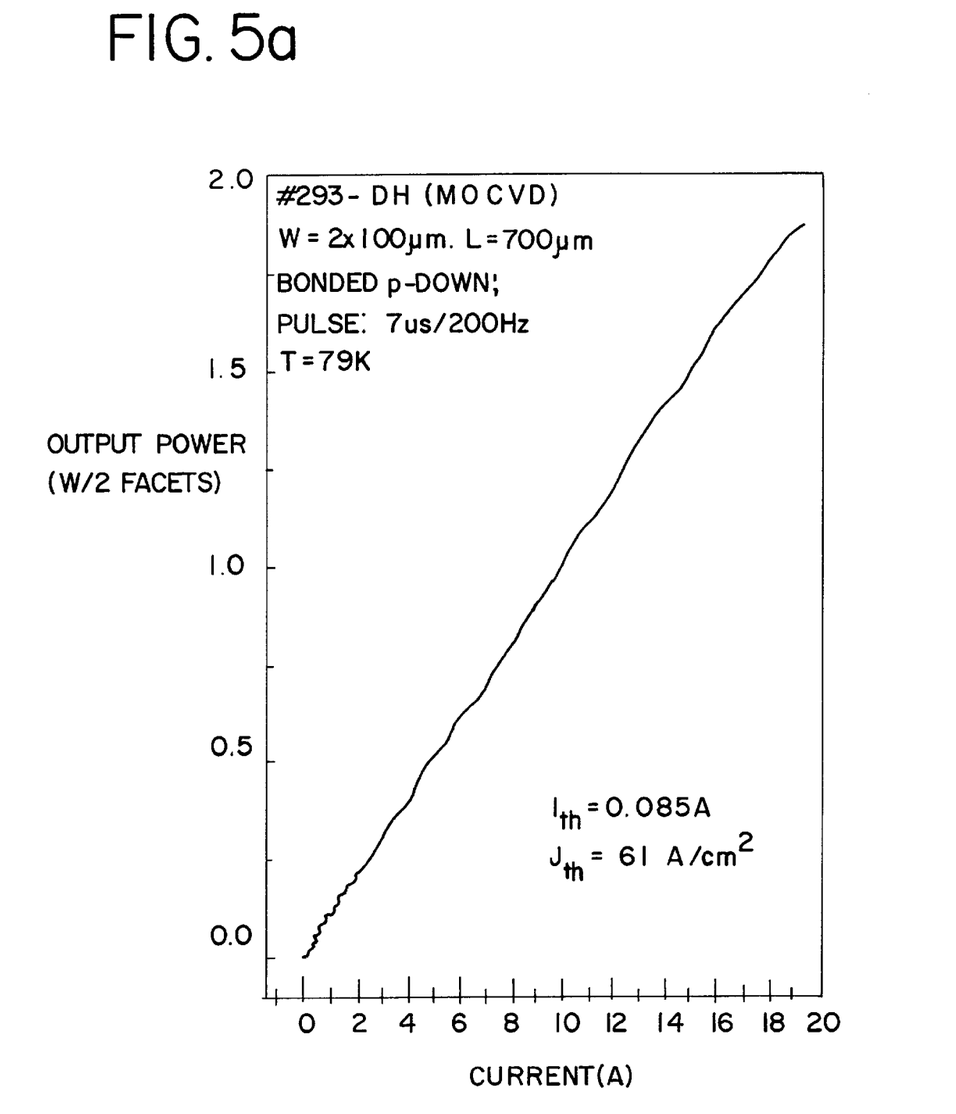
FIG. 5a is a plot of the light-current characteristics of DH InAsSbP/InAsSb/InAs structure under pulse operation at 79 k.
Figure 5B:
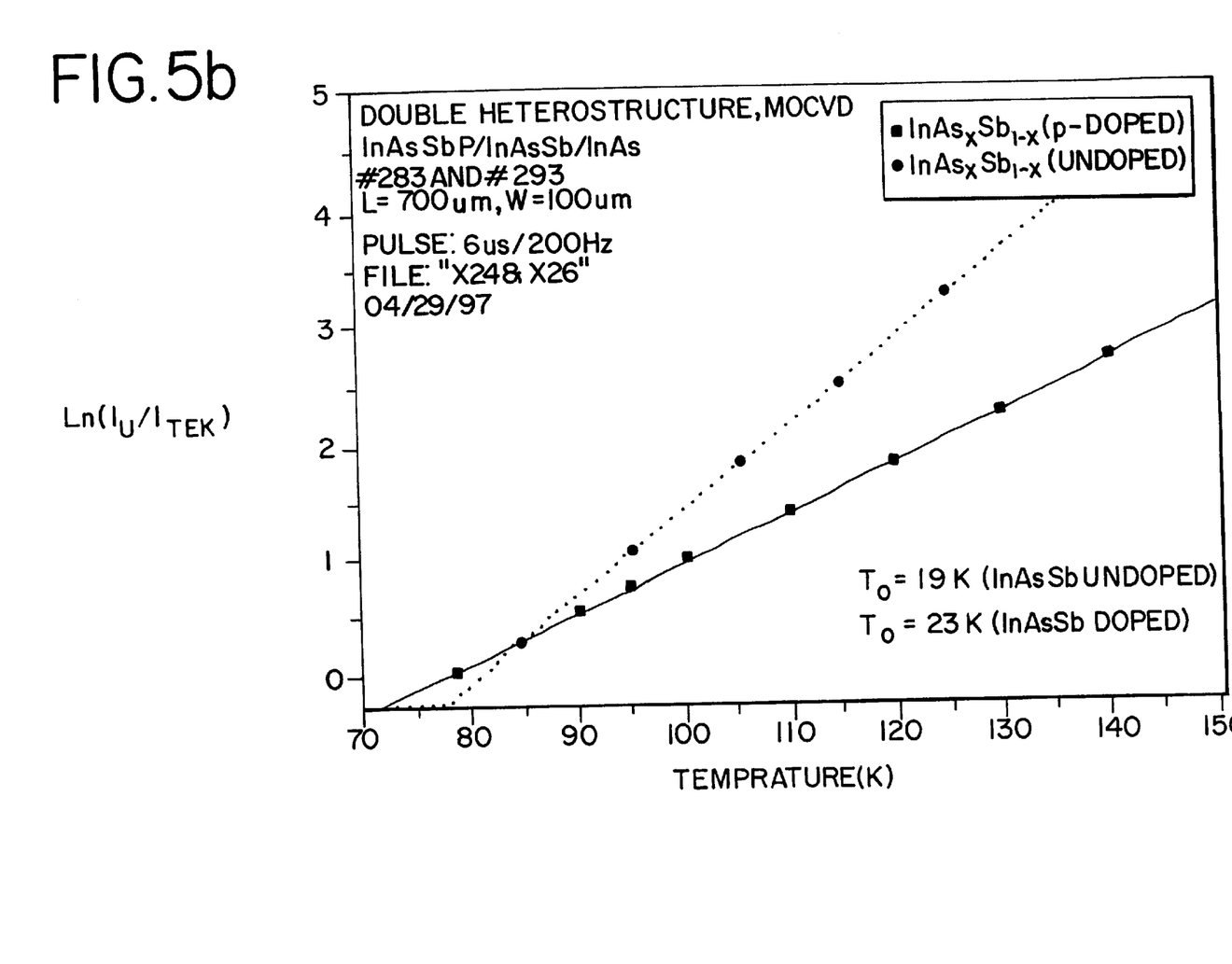
FIG. 5b is a plot showing sensitivity to temperature when doping the active layer of a DH structure.

All of the layers in the fabricated double heterostructure and separate confinement heterostructure are grown by LP-MOCVD and processed into diode lasers ranging from 300 μm to 1500 μm in cavity length, as described above. The light-current characteristics of these DH lasers are illustrated in FIGS. 5a & 5b.

EXAMPLE 1

A double heterostructure for a diode laser was prepared on a (100) oriented Te-doped InAs substrate according to the above methods of MOCVD and in the following manner. First, a 1.21-μm thick InAsSbP cladding layer 2.4 μm wavelength composition doped with Sn N$_A$~7×10$^{17}$ cm$^{-3}$ (the cladding layers may be from 1–3 μm thick); an undoped 1.0 μm active layer of InAs$_{0.95}$Sb$_{0.05}$ (which may be from 1–1000 Å thick) and a 1.20 μm thick Zn-doped InAsSbP, N$_A$~5×10$^{17}$ cm$^{-3}$ cladding layer with a final layer of p$^+$-doped cap layer InAs ($10^{20}$cm$^{-3}$) were successively grown by LP-MOCVD on a Si-doped (100) 2° off InAs substrate. The growth temperature was 500° C. The resulting laser diode formed from this DH structure exhibited a wavelength of $\lambda$=3.2 μm.

EXAMPLES 2–7

The same procedure and layers were grown as in Example 1, with the exception that the InAs p-doped cap layer was replaced with a p-doped InAs$_x$Sb$_{1-x}$, which is a better lattice match to the rest of the structure. By so doing, the current voltage curve was improved, the series resistance decreased and laser performance and life was increased.

Table 2 shows the effects of variation of x in the cap layer of InAs$_x$Sb$_{1-x}$.

TABLE 2

| Example | InAs$_x$Sb$_{1-x}$ Cap Layer | | Mismatch between DH structure and InAs substrate (%) |
| --- | --- | --- | --- |
|  | x | 1-x |  |
| 3 | 1.00 | 0 | 0.07 |
| 4 | .99 | .01 | 1.725 |
| 5 | .75 | .25 | 3.45 |
| 6 | .50 | .50 | 6.83 |
| 7 | .01 | .99 | 6.9 |

Various other heterostructures were prepared using the procedure set forth above, matching InAs with other material systems, such as InP and GaSb systems.

FIG. 3 shows the possibility of lattice matching the InAs with other types of material systems. For instance, the combination of InSb, InAs and InP material gives the quaternary layer InAsSbP that is positioned on the solid line. The solid line represents all lattice matched material with different energy gaps. The importance of the quaternary InAsSbP material is that we are able to change the energy gap of the material while achieving the similar or identical lattice parameters.

Utilizing the diagram of FIG. 3 allows one to lattice match a p-type InAsSb cap layer, in place of the lattice mismatched p-InAs layer, to the structure and to have a lower energy gap in order to improve the ohmic contact and decrease the series resistance (R$_3$).

Normally, the active layer of a laser structure is undoped in order to keep the confinement more efficient. However, in the subject invention, the active region (InAsSb) may be doped with p-type dopants such that the p-n junction is inside the active layer. The growth of these DH lasers by LP-MOCVD leads to a p-doped 1.0 μm-thick active layer InAs$_x$Sb$_{1-x}$ sandwiched between Sn- doped (N$_4$~7×10$^{17}$ cm$^{-3}$) and Zn-doped (N$_a$~5×10$^{17}$ cm$^{-3}$) InAsSbP confining layers with a final layer of p$^+$-doped InAs$_{1-x}$Sb$_{1-x}$($10^{20}$ cm$^{-3}$) cap layer as shown in FIG. 2.

It is found to be desirable for the p-n junction of the laser to be inside the active layer (as shown in FIG. 4); to do so, the active layer must be doped with p-type dopant and be a concentration which is an order of magnitude or one-tenth lower than the concentration of dopant in the adjacent n-type confinement or cladding layer. In other words, if the p-InAsSbP confinement layer is doped with $5\times10^{17}$ cm$^{-3}$ concentration, then the active layer should be doped with $5\times10^{16}$ cm$^{-3}$ concentration.

By doping the active layer with a p-type dopant in the above manner, the laser performance will be improved. FIG. 5a illustrates the light-current characteristics of a DH InAsSb/InAsSb/InAs laser under pulse operation at 78 k. The incorporation of a p-doped active layer permitted the InAsSbP/InAsSb/InAs lasers to emit high output powers of 2 W in pulse operation and the ability to run these lasers in continuous wave operation efficiently. Furthermore, when the active layer is doped with p-type dopant, the characteristic temperature ($T_o$) is increased. FIG. 5b shows an example of two types of double heterostructure lasers. In one structure, the active layer is undoped and the $T_o$ is estimated to be 13 k. However, as the active layer is doped with p-typeddopant, the $T_o$ is increased from 40°K100°K. The laser becomes less sensitive to the temperature and more reliable.

Figure 6A:
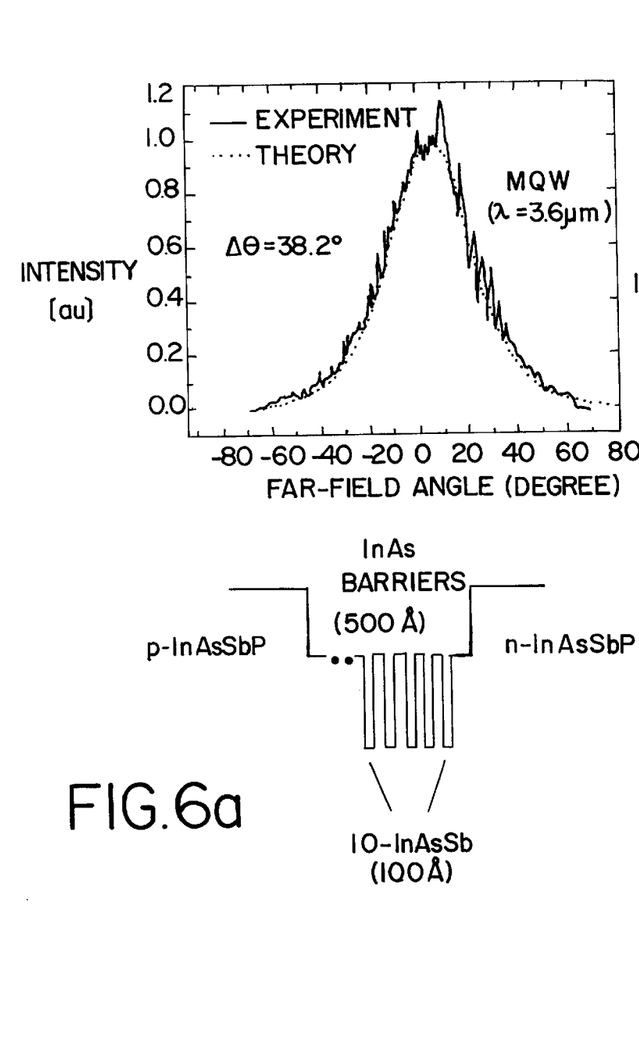
FIGS. 6a and 6b are graphs of intensity vs. far-field angle comparing the band offset of two MQW structures.
Figure 6B:
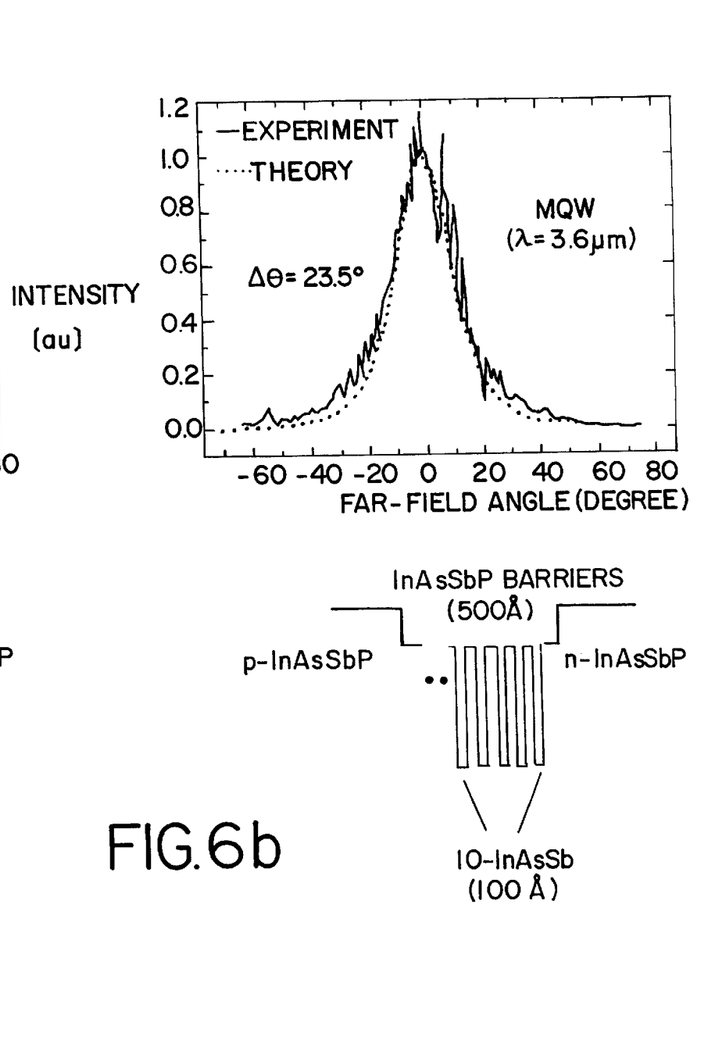

In the use of separate confinement heterostructure (SCH) InAsSbP/InAsSb/InAs, a decrease of the band-offset between the waveguide layer and confinement layers results in a decrease of the far-field or an increase in the brightness of the lasers. By decreasing the discontinuity and increasing confinement, the current density will decrease and output power and efficiency may be increased. This is best shown in FIGS. 6a and 6b wherein the far-field ($\Delta\Theta$) is decreased from 6a to 6b when the band offset is decreased from 50–100 MeV in FIG. 6a to 20–30 MeV in FIG. 6b. The resulting lasers are correspondingly brighter. The far-field is 38° in FIG. 6a and 23° in FIG. 6b and thus the light is more focused.

In a further embodiment of this invention a separate confinement heterostructure laser with minimum discontinuity of conduction band between confinement layers and waveguide by changing the waveguide and active layer region as follows:

(a) The active layer is a multi-quantum well such that the thickness of the well is between 50 Å up to 300 Å.

(b) The thickness of the barriers is between soA up to 500 Å.

(c) The thickness of the optical waveguide is between 1000 Å and 1 µm.

(d) The number of quantum wells is 1 to 10 wells and undoped. Half of the structure is undoped and the other half of the structure is p-doped. When p-doping, the carrier concentration is one order of magnitude less than the doping of the confinement layers.

In this manner a laser structure can be tuned as to each of wavelength, brightness, performance, efficiency and for minimum current density. By the adjustment of the above parameters within the guidelines specified above, a laser structure may be tailored to specific requirements at that time.

Figure 7:
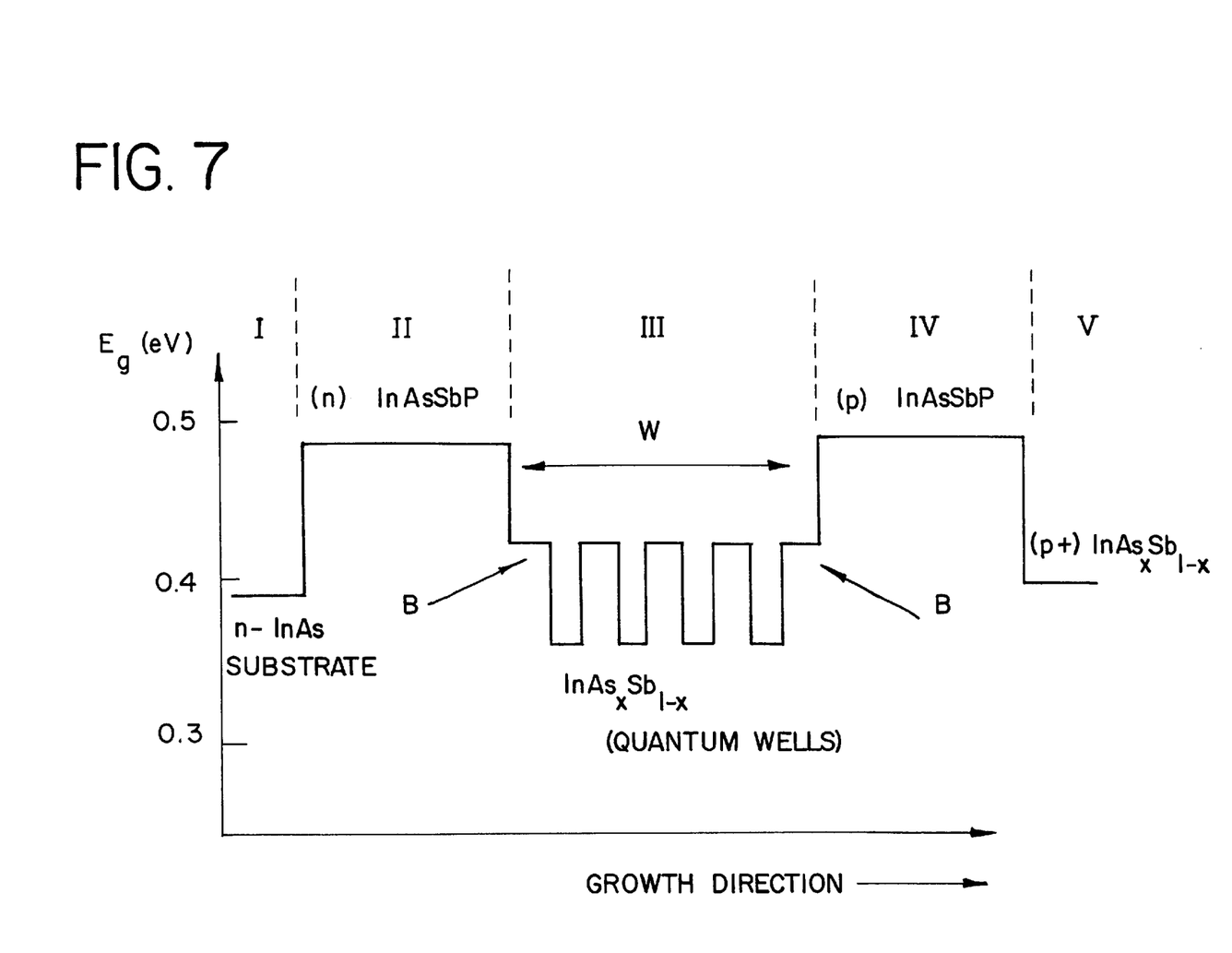
FIG. 7 is a band diagram of a multiple quantum well structure.
Figure 8:
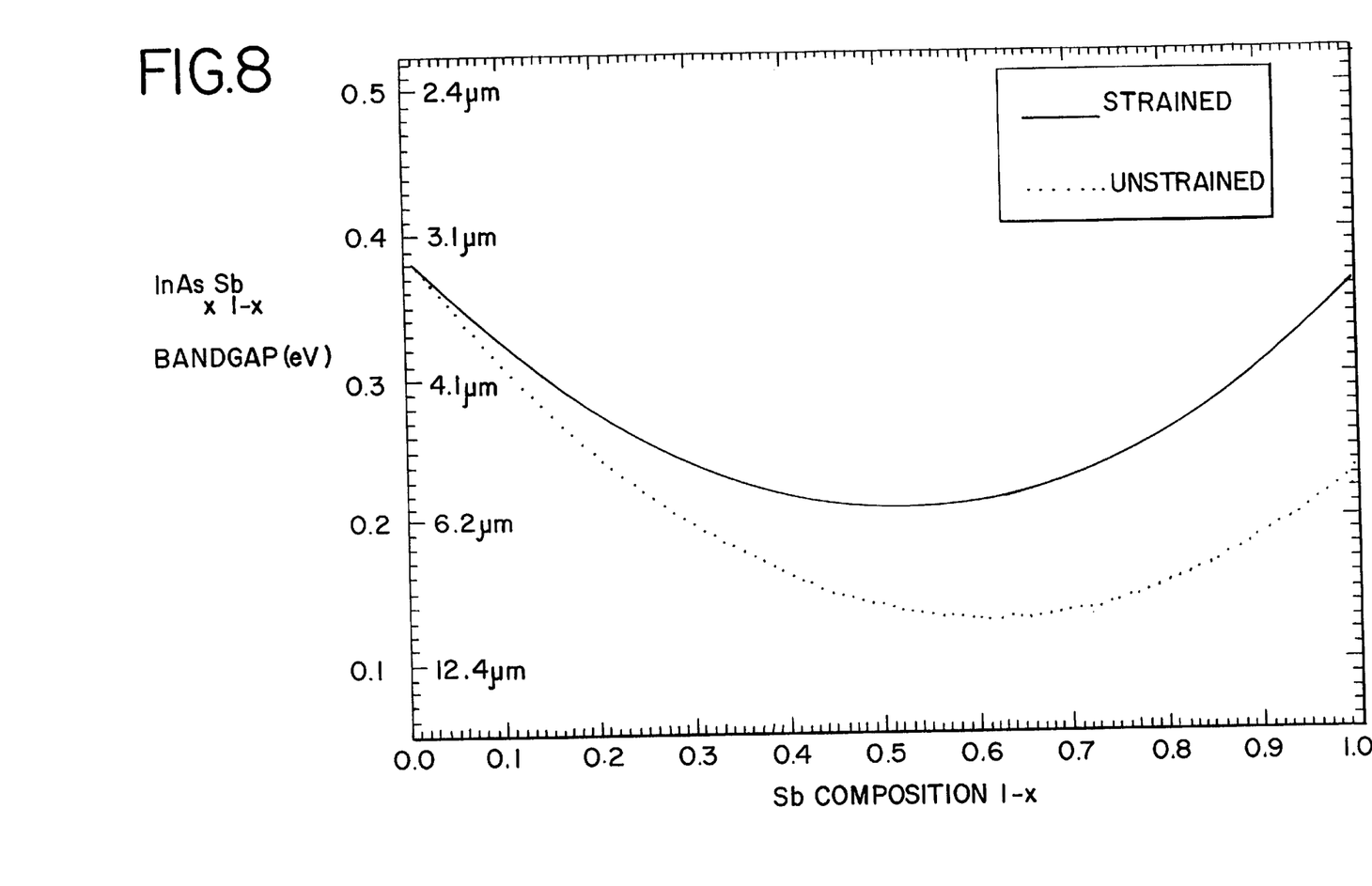
FIG. 8 is a graph of bandgap vs. the $Sb_{1-x}$ composition in the composition $InAs_xSb_{1-x}$.

In a further aspect of the subject invention, the emitting wavelength ($\lambda$) of lasers may be changed between 3 µm up to 5 µm. To do so, the composition of the active layer InAs$_x$Sb$_{1-x}$ in double heterostructure (DH) or in separate confinement heterostructure (SCH) is changed. For DH lasers, the composition of the active layer InAs$_x$Sb$_{1-x}$ is changed. For separate confinement heterostructure lasers, the composition of InAs$_x$Sb$_{1-x}$ and the thickness of the quantum well in the active layer is changed. FIG. 7 illustrates the change in both bandgap and wavelength as the composition of Sb$_{1-x}$ is changed for both a strained and unstrained structure.

In general, lasers have a semiconductor material that can be used as an active medium (in this case InAs$_x$Sb$_{1-x}$) to emit light that has a wavelength inversely proportional to the energy difference between the conduction band ($E_c$) and valence band ($E_v$). This difference is called the energy gap, $E_g$. When the energy gap, $E_g=E_c-E_v$, is expressed in units of electron volts (Ev), the laser wavelength, $\lambda$, in units of micrometers (µm) can be expressed as $$\lambda = \frac{hc.}{E_g} = \frac{1.24}{E_g} \qquad \text{Eq. (1)}$$

where h represents Planck constant and c is the speed of light. Since the wavelength depends on energy gap ($E_g$), it is a characteristic of the type of semiconductor material used as the laser medium. In a compound semiconductor (for instance, InAs$_x$Sb$_{1-x}$), the wavelength of the emitted light can be tailored over a wide range by changing the material composition of the active layer as well as by changing the number and thickness of the quantum wells. The thickness of the barrier and the waveguide all as set forth above. Further, in a MQW structure, the first half of the quantum well structure is undoped, while the second half is doped on a level of at least one order of magnitude less than the adjacent confinement layer. This has the effect of placing the p-n junction within the waveguide and can be used to tune the wavelength and other parameters as desired.

Figure 9A:
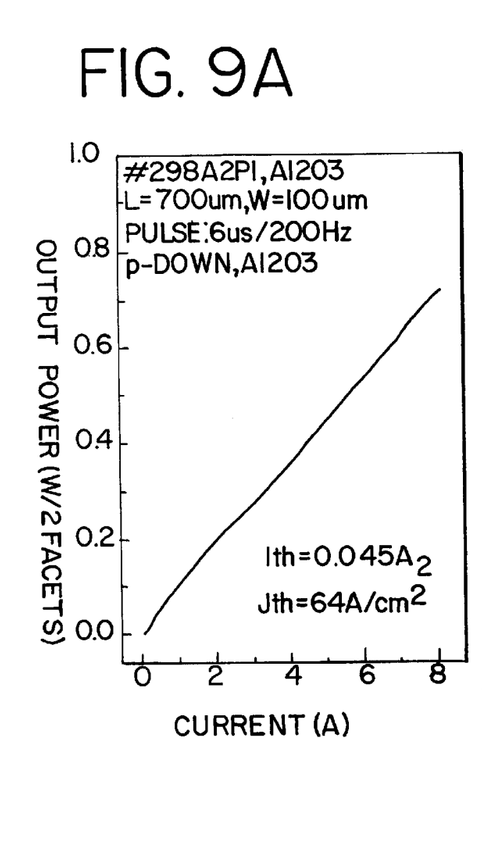
FIGS. 9a–9c are graphs of power vs. current showing the effect of increasing the number of wells.
Figures 9B, 9C:
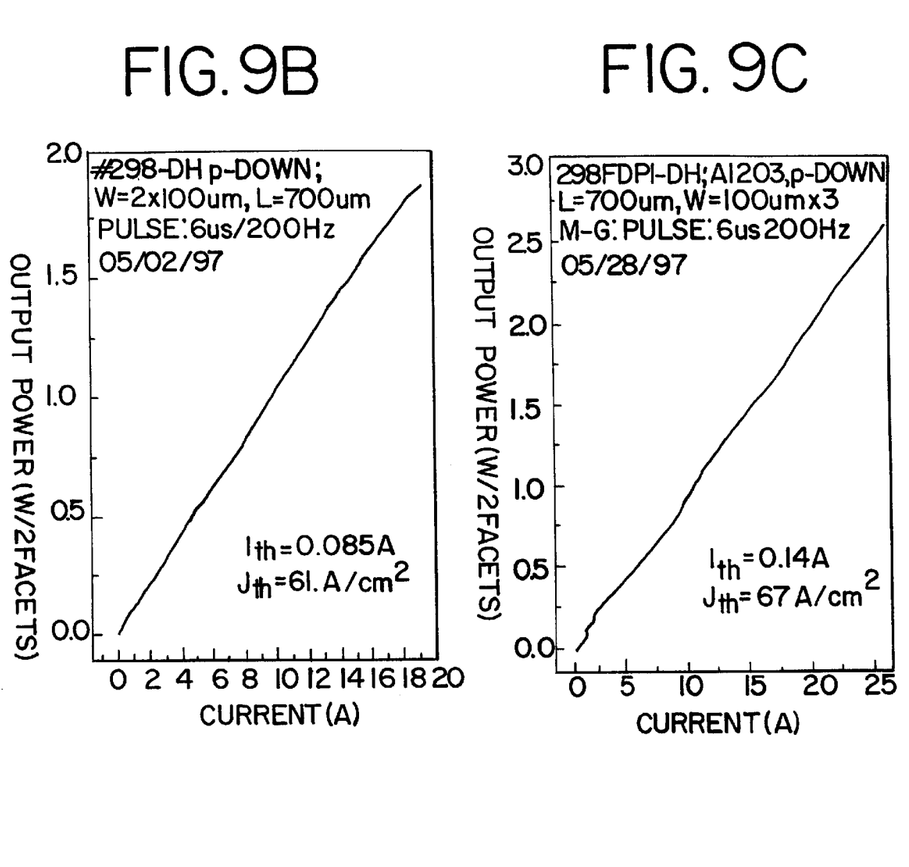
Figure 10A:
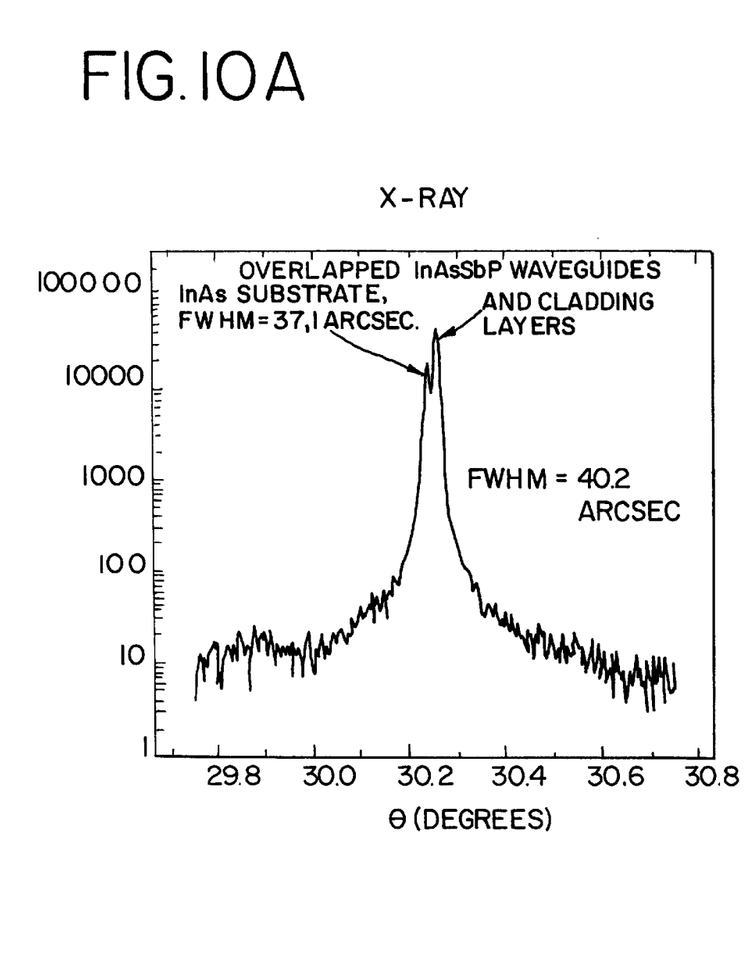
FIGS. 10a and 10b are graphs structurally and optically characterizing a 3.6 μm structure of InAsSb/InAsSbP/InAs.
Figure 10B:
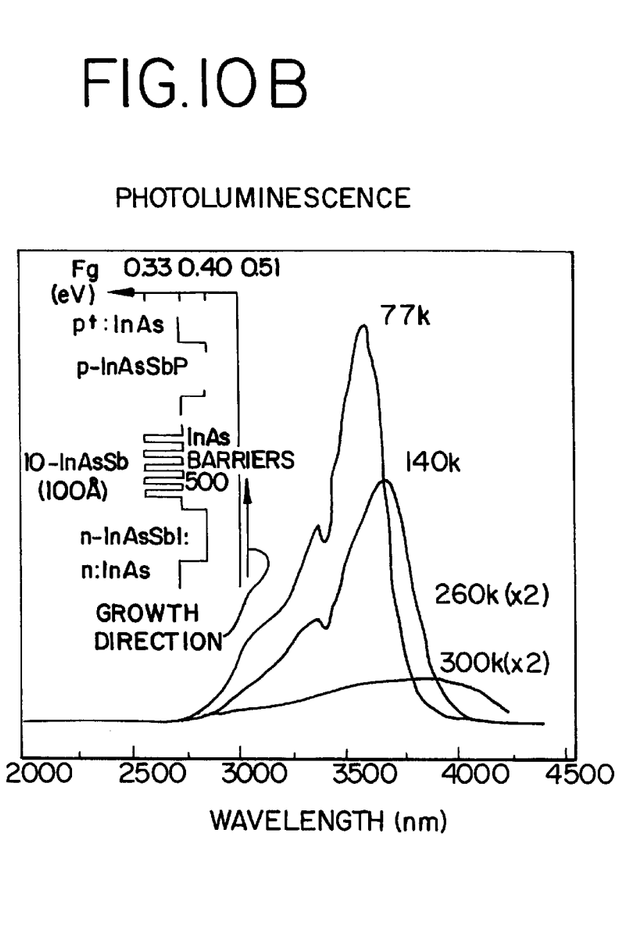
Figure 11A:
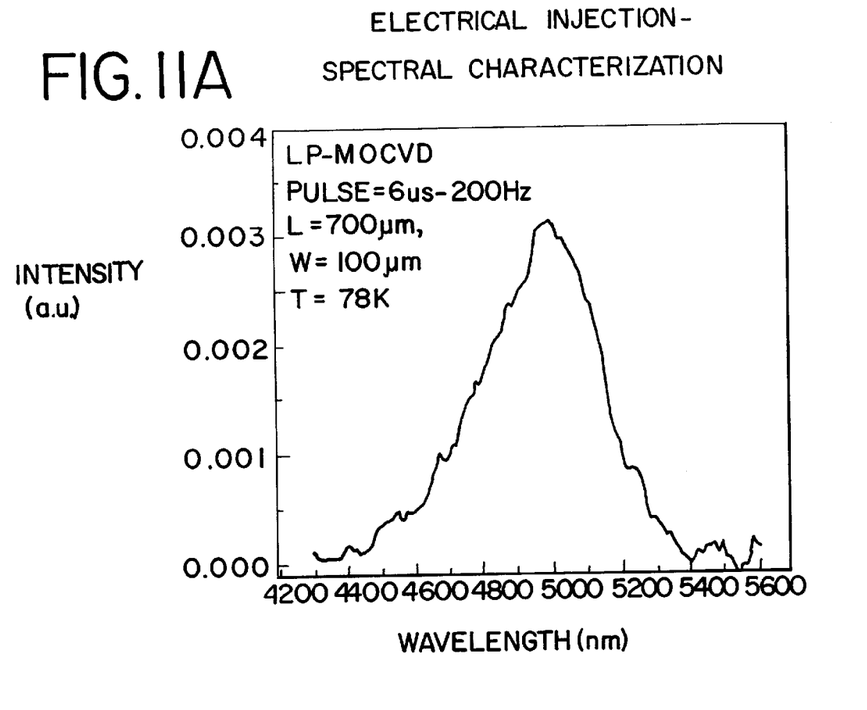
FIGS. 11a and 11b are graphs showing a spectral and structural characterization of a 5.0 μm InAsSbP/InAsSb/InAs structure.
Figure 11B:
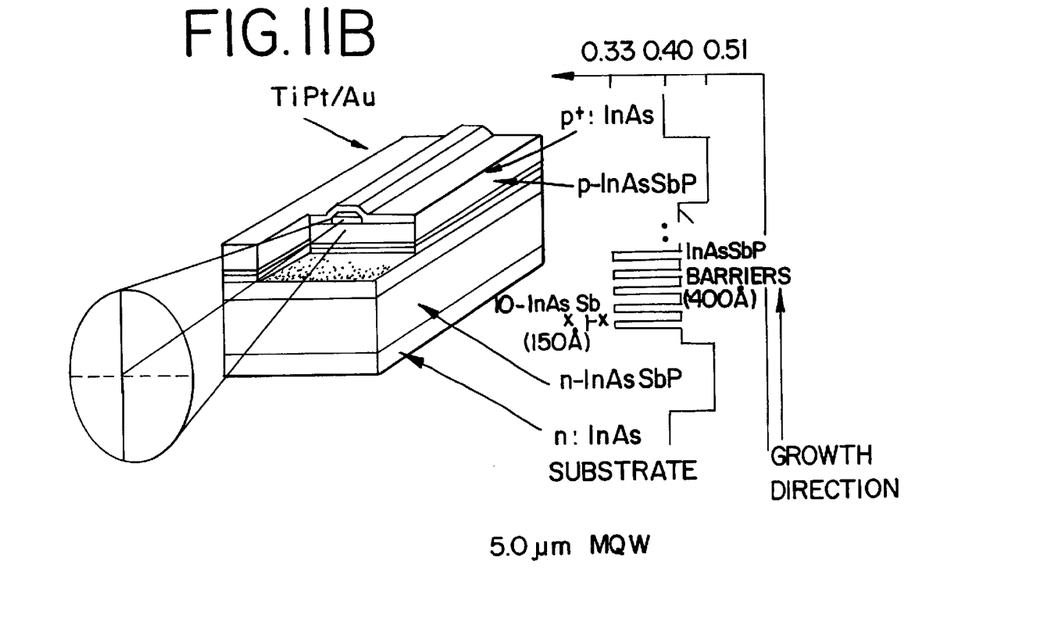
Figure 12A:
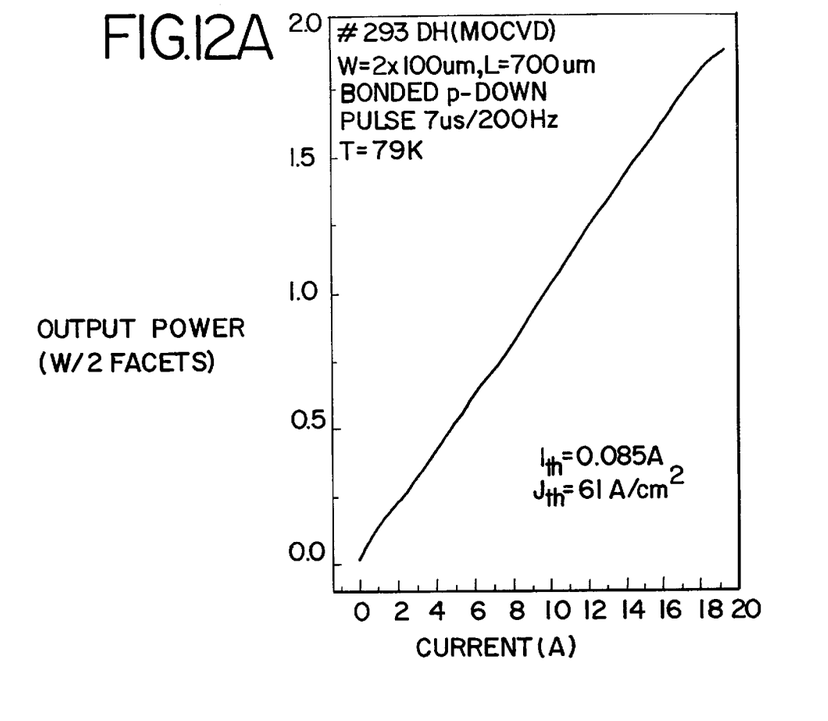
FIGS. 12a and 12b are a graph of power vs. current and a structural characterization of a 3.2 μm InAsSbP/InAsSb/InAs structure.
Figure 12B:
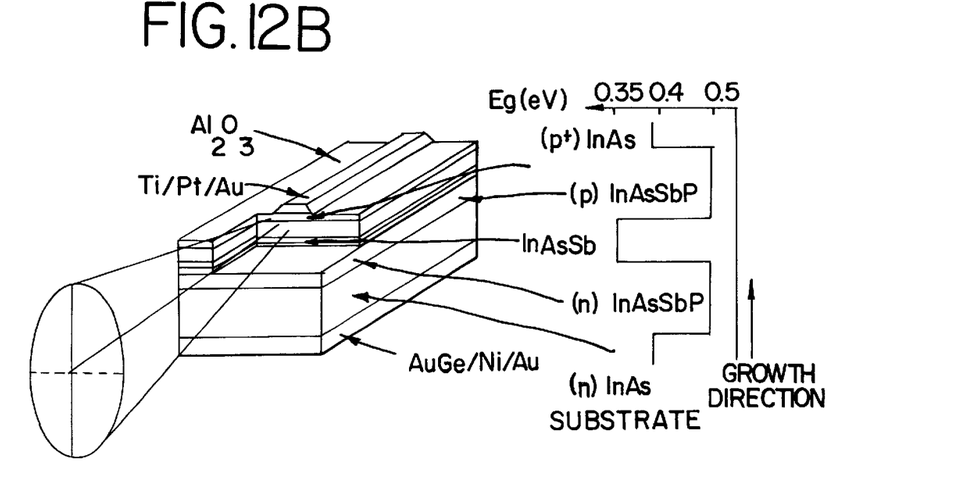

FIGS. 8–11 are examples of this ability to tune the structure to give a user a laser predetermined properties. For instance, FIGS. 8a–8c show the effect of increasing the number of wells. FIGS. 9 and 10 show the effect of varying well and barrier thickness, while FIG. 11 shows a low wavelength structure of 3.2 µm in contrast to the high (5.0 µm) wavelength of FIG. 10.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims. Various features of the invention are set forth in the following claims.

I claim:

1. A method for preparing a double heterostructure for a laser apparatus, said heterostructure having an active layer of InAsSb and an upper confinement layer of InAsSbP, the InAsSbP layer having certain lattice parameters, comprising the step of growing a cap layer comprising a layer of InAs$_x$Sb$_{1-x}$($0.01 \leq - \leq 0.99$) on said upper confinement layer, said cap layer having the same lattice parameters as said upper confinement layer, thereby eliminating lattice mismatch between said upper confinement layer and said cap layer.

* * * * *